(12) United States Patent
Kuwata et al.

(10) Patent No.: US 7,700,955 B2
(45) Date of Patent: Apr. 20, 2010

(54) SEMICONDUCTOR DEVICE AND OPTICAL APPARATUS

(75) Inventors: Yasuaki Kuwata, Kanagawa (JP); Hideo Nakayama, Kanagawa (JP); Ryoji Ishii, Kanagawa (JP); Kayoko Nakamura, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 327 days.

(21) Appl. No.: 11/982,930

(22) Filed: Nov. 6, 2007

(65) Prior Publication Data
US 2008/0224167 A1    Sep. 18, 2008

(30) Foreign Application Priority Data
Mar. 15, 2007   (JP) .................. 2007-067152

(51) Int. Cl.
| | |
|---|---|
| H01L 29/26 | (2006.01) |
| H01L 27/15 | (2006.01) |
| H01L 29/267 | (2006.01) |
| G02B 6/26 | (2006.01) |
| G02B 6/36 | (2006.01) |
| H01S 5/00 | (2006.01) |
| H01S 3/20 | (2006.01) |
| H01S 3/08 | (2006.01) |

(52) U.S. Cl. .................. 257/79; 257/81; 257/84; 257/99; 257/E27.12; 385/21; 385/33; 385/40; 385/93; 372/45.01; 372/50.21; 372/54; 372/94; 372/97; 372/98

(58) Field of Classification Search ............. 257/79, 257/99, 81, 84, E27.12; 385/20, 21, 33, 40, 385/93; 372/45.01, 50.21, 54, 94, 97, 98
See application file for complete search history.

(56) References Cited

U.S. PATENT DOCUMENTS 7,538,357 B2 *   5/2009   Onishi et al. .............. 257/93
2006/0285567 A1 *  12/2006  Otoma ...................... 372/50.1

FOREIGN PATENT DOCUMENTS

| JP | 5-121710 | 5/1993 |
|---|---|---|
| JP | 10-132558 | 5/1998 |
| JP | 2005-286284 | 10/2005 |

* cited by examiner

Primary Examiner—Long K Tran
(74) Attorney, Agent, or Firm—Fildes & Outland, P.C.

(57) ABSTRACT

A semiconductor device includes a substrate, a semiconductor layer formed on the substrate, and an optically functional portion formed by using at least a portion of the semiconductor layer. The optically functional portion performs light emission or light reception. The semiconductor device further includes a first driving electrode that is electrically connected to a semiconductor layer on a surface of the optically functional portion, and the first driving electrode drives the optically functional portion. The semiconductor device further includes an encapsulating electrode that is formed on the semiconductor layer to surround periphery of the optically functional portion, and electrically connected to the first driving electrode.

11 Claims, 11 Drawing Sheets

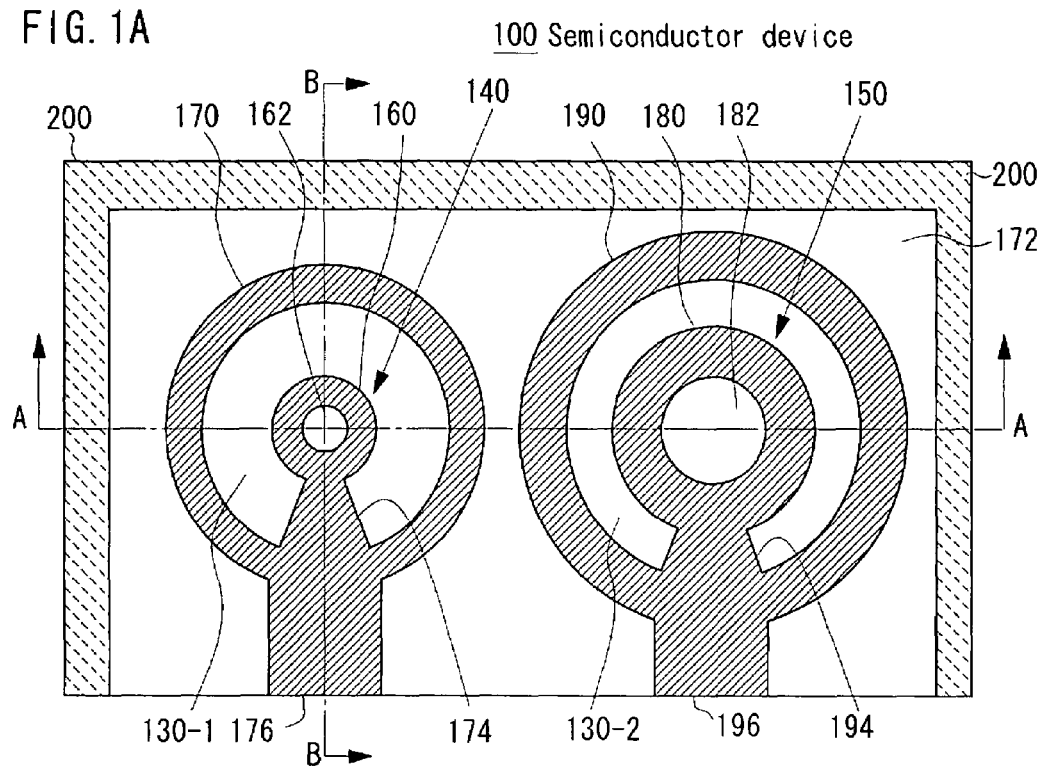
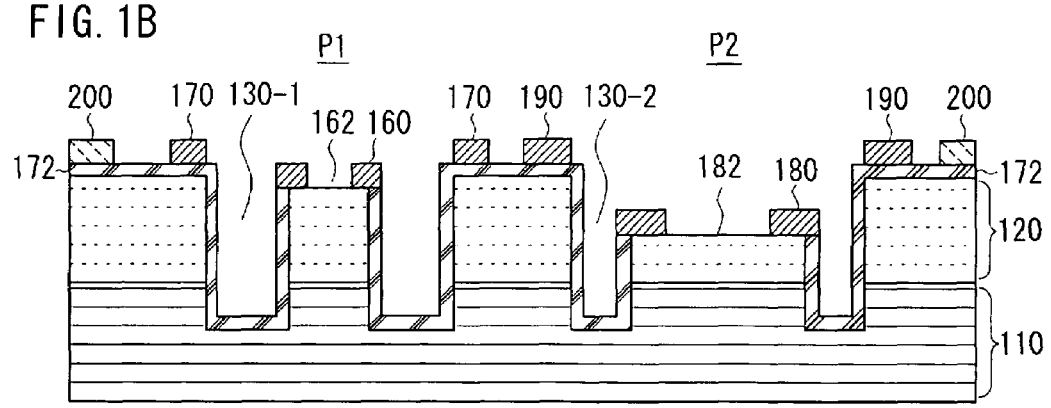

Cross section along line B-B

FIG. 10A  104 Semiconductor device module
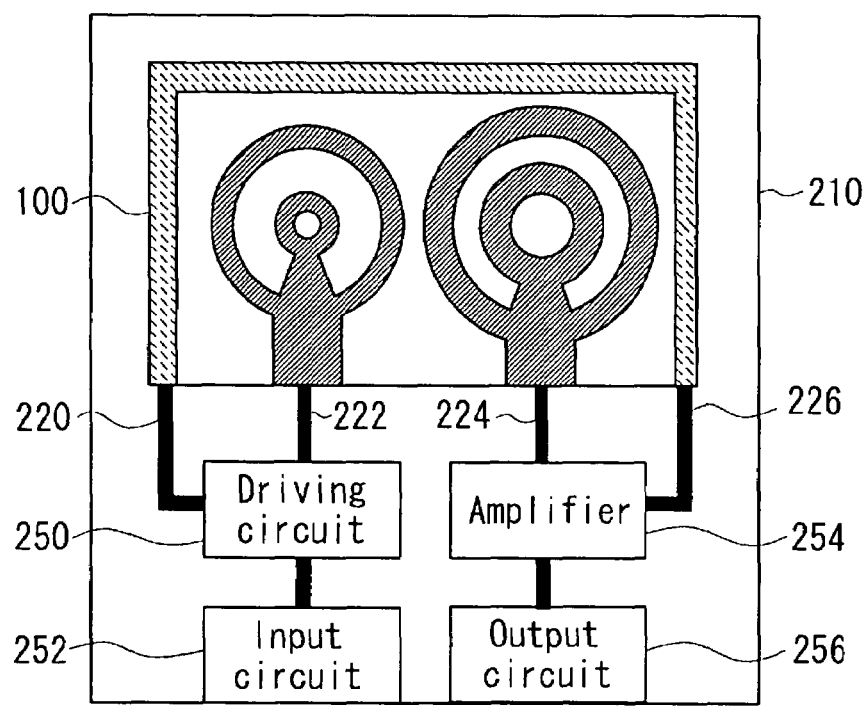
FIG. 10B
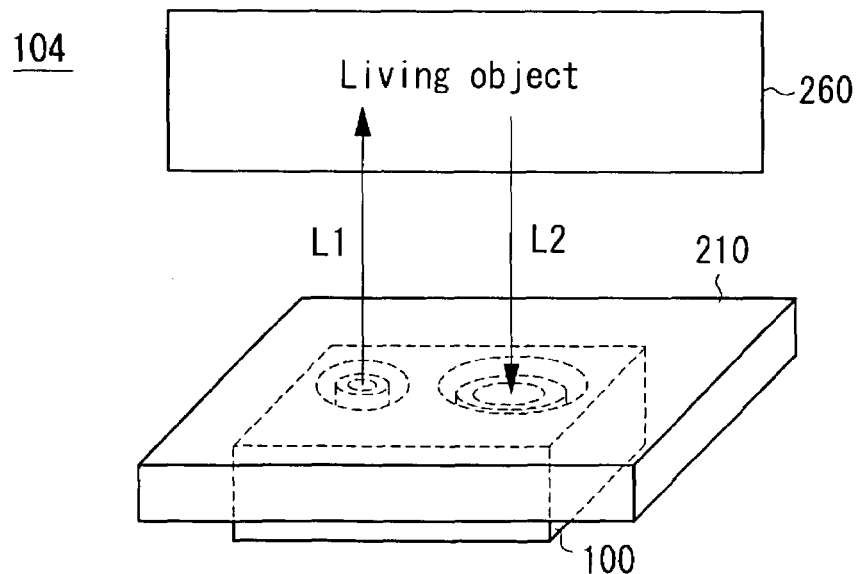

US 7,700,955 B2

SEMICONDUCTOR DEVICE AND OPTICAL APPARATUS

CROSS-REFERENCE TO RELATED APPLICATIONS

This application is based on and claims priority under 35 USC 119 from Japanese Patent Application No. 2007-067152 filed Mar. 15, 2007.

BACKGROUND

1. Technical Field

This invention relates to a semiconductor device and an optical apparatus.

2. Related Art

As light sources for data communication using optical fibers or the like or for a data processing apparatus such as a copier, surface emitting semiconductor lasers, i.e., Vertical-Cavity Surface-Emitting Laser diodes (hereinafter referred to as VCSEL), which consume less power and can be easily arranged in two dimensional arrays, have been used.

A typical mounting example of a semiconductor device of a related art is shown in FIGS. 11A to 11C. As shown in FIG. 11A, a semiconductor device 10 includes a light emitting portion 12 such as a VCSEL and a p-side electrode 14 and an n-side electrode 16 of the light emitting portion 12. As shown in FIG. 11B or FIG. 11C, in the semiconductor device 10, the light emitting portion 12 and the electrodes 14 and 16 face a mounting substrate 18. The electrodes 14 and 16 are connected to a wiring pattern of the mounting substrate 18. The surrounding or the entirety of the light emitting portion 12 is encapsulated with a resin 20 to obtain a semiconductor device module. However, in general, the resin 20 has moisture permeability, and thus for devices, in which moisture is not desirable, a more highly hermetic encapsulation is needed to ensure reliability.

As shown in FIG. 12A, to improve hermeticity of the light emitting portion 12 of the semiconductor device 10, there is a method in which an encapsulating electrode 22 is formed to surround the electrodes 14 and 16 of the light emitting portion 12, and the encapsulating electrode 22 is connected to the mounting substrate 18. In this case, the encapsulating electrode 22 becomes an obstacle when the wiring pattern connected to the electrodes 14 and 16 is extracted from the surface of the mounting substrate.

The present invention aims to provide a semiconductor device in which hermeticity of an optically functional portion such as a light emitting portion or a light receiving portion can be enhanced, and a wiring can be extracted from a mounting substrate surface, and an optical apparatus using the semiconductor device.

SUMMARY

An aspect of the present invention provides a semiconductor device that includes a substrate, a semiconductor layer formed on the substrate, and an optically functional portion formed by using at least a portion of the semiconductor layer. The optically functional portion performs light emission or light reception. The semiconductor device further includes a first driving electrode that is electrically connected to a semiconductor layer on a surface of the optically functional portion, and the first driving electrode drives the optically functional portion. The semiconductor device further includes an encapsulating electrode that is formed on the semiconductor layer to surround periphery of the optically functional portion, and electrically connected to the first driving electrode.

BRIEF DESCRIPTION OF THE DRAWINGS

Exemplary embodiments of the present invention will be described in detail based on the following figures, wherein:

FIG. 1A is a plan view of a VCSEL according to an example of the present invention;

FIG. 1B is a cross sectional view taken along line A-A of FIG. 1A;

FIGS. 10A and 10B show a semiconductor device module applied to a living object sensor;

DETAILED DESCRIPTION

Referring to the accompanying drawings, exemplary embodiments for implementing the present invention will be described. Shown herein is an example in which one light emitting portion and one light receiving portion are monolithically formed on a substrate.

Figure 2:
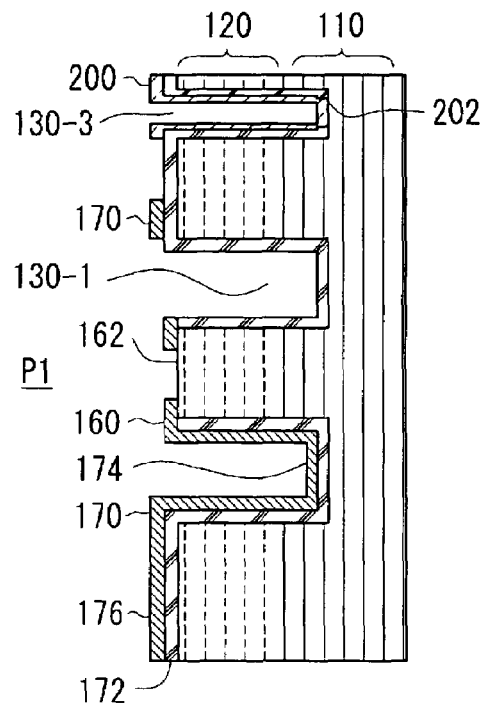
FIG. 2 is a cross sectional view taken along line B-B of FIG. 1A.

FIG. 1A is a plan view of a semiconductor device according to a first example of the present invention, and FIG. 1B is a cross sectional view taken along line A-A of FIG. 1A. FIG. 2 is a cross sectional view taken along line B-B of FIG. 1A. In FIG. 1A, an electrode formed on the surface of a semiconductor device is indicated by a hatch pattern for ease of understanding.

A semiconductor device 100 of this example has an n-type semiconductor layer 110 on an n-type substrate and a p-type semiconductor layer 120 overlaid thereon. In the p-type semiconductor layer 120, two ring shaped grooves 130-1 and 130-2 are formed. The grooves 130-1 and 130-2 have a depth ranging from the p-type semiconductor layer 120 to the n-type semiconductor layer 110. A cylindrical post structure (hereinafter referred to as post) P1 is defined by the groove 130-1, and a light emitting portion 140 is formed in the post P1. By the groove 130-2, a cylindrical post P2 is formed, and a light receiving portion 150 is formed in the post P2. In addition, as shown in FIG. 2, a groove 130-3 is formed for connecting an n-side driving electrode 200 described later to the n-type semiconductor layer 110.

The light emitting portion 140 may be an LED or a VCSEL. In a case of a VCSEL, the n-type semiconductor layer 110 and the p-type semiconductor layer 120 may compose a vertical resonator with Distributed Bragg Reflectors (DBRs), and may include an active layer in the vertical resonator.

On the p-type semiconductor layer 120 excepting top portions of the posts P1 and P2, an insulating layer 172 of SiOx or the like is formed. On the p-type semiconductor layer 120 exposed at a top portion of the post P1, a p-side driving electrode 160 is formed, and the p-side driving electrode 160 is ohmic-contacted to the p-type semiconductor layer 120. The p-side driving electrode 160 has an annular shape, and a round-shaped opening 162 is formed at a center portion of the p-side driving electrode 160. The opening 162 functions as a window for emitting light.

An annular encapsulating electrode 170 is formed such that it surrounds outer periphery of the post P1 or the light emitting portion 140. The encapsulating electrode 170 is formed on the p-type semiconductor layer 120 outside of the groove 130-1 through the insulating layer 172. The encapsulating electrode 170 includes an internal connection electrode 174 extending such that a portion of the annular electrode conforms along the groove 130-1 and being connected to the p-side driving electrode 160, and an external connection electrode 176 for making a connection with outside of the semiconductor device. Preferably, the p-side driving electrode 160 and the encapsulating electrode 170 are made of a same metal material, and patterned simultaneously.

On the p-type semiconductor layer 120 exposed at a top portion of the post P2, a p-side driving electrode 180 is formed. The p-side driving electrode 180 is ohmic-contacted to the p-type semiconductor layer 120. The p-side driving electrode 180 has an annular shape, and a round-shaped opening 182 is formed at a center portion of the p-side driving electrode 180. The opening 182 functions as a window for emitting light.

An annular encapsulating electrode 190 is formed such that it surrounds outer periphery of the post P2 or the light receiving portion 150. The encapsulating electrode 190 is formed on the p-type semiconductor layer 120 outside of the groove 130-2 through the insulating layer 172. The encapsulating electrode 190 includes an internal connection electrode 194 extending such that a portion of the annular electrode conforms along the groove 130-2 and being connected to the p-side driving electrode 180, and an external connection electrode 196 for making a connection with outside of the semiconductor device. Preferably, the p-side driving electrode 180 and the encapsulating electrode 190 are made of a same metal material, and patterned simultaneously.

On the outer periphery of the semiconductor device 100, the n-side driving electrode 200 is formed. As shown in FIG. 2, the n-side driving electrode 200 is routed on the p-type semiconductor layer 120 through the insulating layer 172, and extends to a bottom portion of the groove 130-3. The extension of the n-side driving electrode 200 is electrically connected to the n-type semiconductor layer 110 through a contact hole 202 formed in the insulating layer 172 at a bottom portion of the groove 130-3. The n-side driving electrode 200 becomes a common n-side electrode to the light emitting portion 140 and to the light receiving portion 150.

As shown in FIG. 1B, the p-side driving electrode 160 at the top portion of the post P1 is slightly lower than the encapsulating electrodes 170 and 190. The difference is equivalent to the film thickness of the insulating layer 172 formed on the p-type semiconductor 120. In addition, the p-side driving electrode 180 at the top portion of the post P2 is lower than the p-side driving electrode 160 at the top portion of the post P1. By forming the p-side driving electrodes 160 and 180 lower than the encapsulating electrodes 170 and 190, when the semiconductor device is flip-chip mounted on a mounting substrate, the p-side driving electrodes 160 and 180 can be spaced apart from the mounting substrate such that stress would not applied onto the light emitting portion 140 and the light receiving portion 150. However, the p-side driving electrodes 160 and 180 are not necessarily formed lower than the encapsulating electrodes 170 and 190, and all electrodes may be in a same plane.

Figure 3:
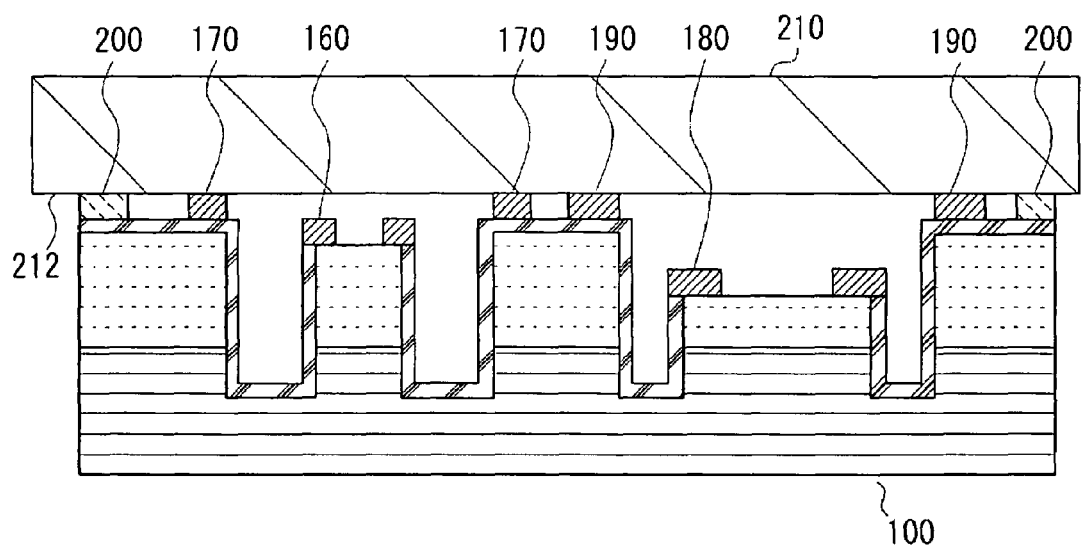
FIG. 3 is a cross sectional view of a semiconductor device that is flip-chip mounted on a mounting substrate.

FIG. 3 is a cross sectional view of a semiconductor device module (optical apparatus) in which the semiconductor device shown in FIGS. 1A and 1B is mounted. A semiconductor device module 102 includes a mounting substrate 210 and the semiconductor device 100 that is flip-chip mounted onto the mounting substrate 210. For the mounting substrate 210, a material that has optical transparency, for example, a glass substrate, may be used. On a surface 212 of the mounting substrate 210, wiring patterns made of a transparent metal material such as ITO is formed. The posts P1 and P2 of the semiconductor device 100 face the mounting substrate 210. The encapsulating electrodes 170 and 190 are connected to a corresponding wiring pattern through the external connection electrodes 176 and 196. The n-side driving electrode 200 is connected to a corresponding wiring pattern. The connection of the electrodes may be performed by soldering reflow, for example.

For the semiconductor device module, the semiconductor device 100 may be encapsulated with a thermosetting resin, for example. By this process, the strength of connection between the semiconductor device 100 and the mounting substrate 210 can be enhanced, and the semiconductor device 100 can be protected. Alternatively, a resin may encapsulate a portion of the semiconductor device 100, or encapsulate a portion of the semiconductor device 100 and the mounting substrate 210.

Figure 4A:
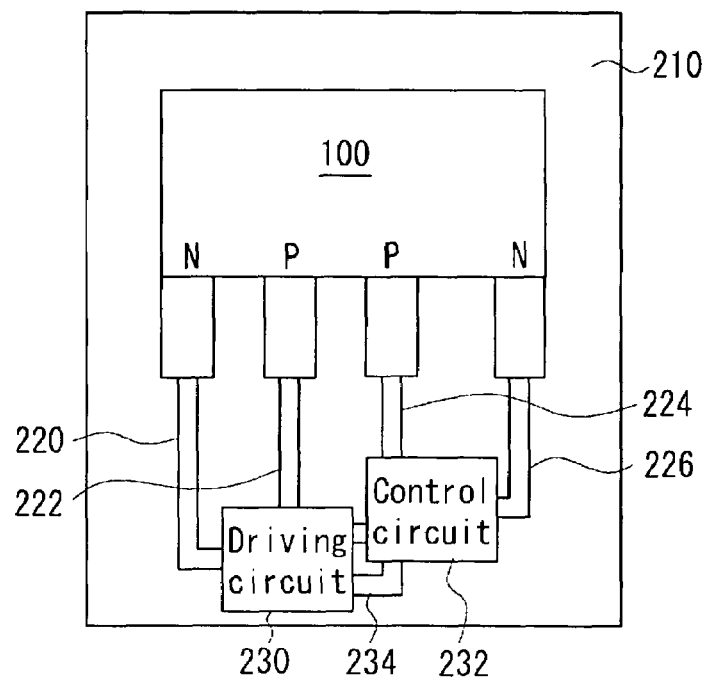
FIG. 4A is a cross sectional view of a semiconductor device module.
Figure 4B:
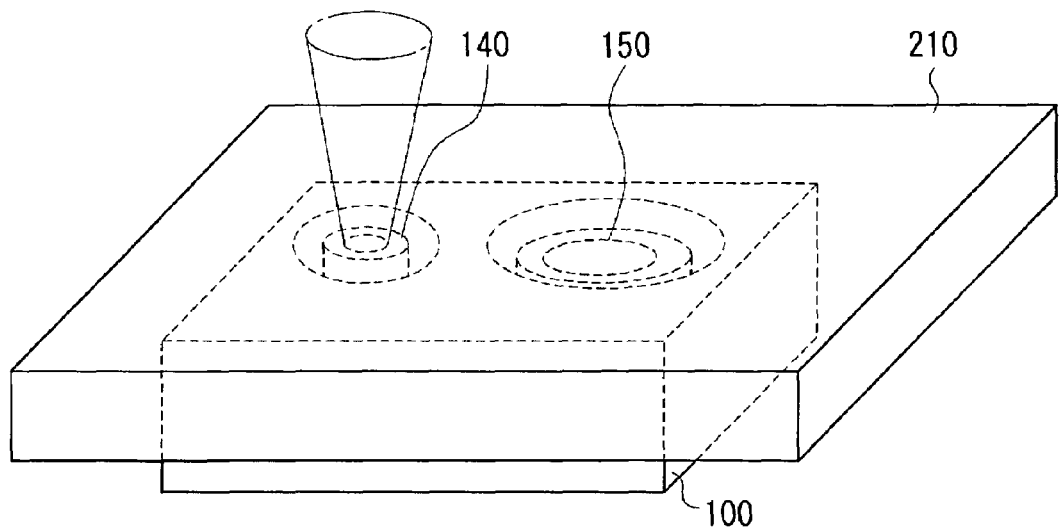
FIG. 4B is a perspective view of a semiconductor device module viewed from above thereof.

FIG. 4A shows a semiconductor device module viewed from backside thereof in which an electronic circuit is mounted on a mounting substrate. FIG. 4B is a schematic perspective view of a semiconductor device module when viewed from above thereof. As shown in FIG. 4A, on the surface 212 of the mounting substrate 210, wiring patterns 220, 222, 224, and 226 are formed. The wiring patterns 222 and 224 are connected to the external connection electrodes 176 and 196 of the semiconductor device 100, in other words, connected to the p-side driving electrodes 160 and 180 through the encapsulating electrodes 170 and 190, and the wiring patterns 220 and 226 are connected to the n-side driving electrode 200.

The wiring pattern 220 is connected to an output terminal on a negative electrode side of a driving circuit 230, and the wiring pattern 222 is connected to an output terminal on a positive electrode side of the driving circuit 230. The wiring pattern 224 is connected to an input terminal on a positive electrode side of a control circuit 232, and the wiring pattern 226 is connected to an input terminal on a negative electrode side of the control circuit 232. The control circuit 232 is connected to the driving circuit 230 via a wiring pattern 234.

When the driving circuit 230 applies a driving current to the light emitting portion 140 through the wiring patterns 220 and 222, the light emitting portion 140 emits light from the opening 162 as shown in FIG. 4B. The light passes through the mounting substrate 210, and is injected into an optical component such as a lens, mirror, or optical fiber. A portion of the light emitted from the light emitting portion 140 is received by the light receiving portion 150 through the opening 182. The light receiving portion 150 outputs an electrical signal that corresponds to the amount of received light or the intensity of received light. The electrical signal is provided to the control circuit 232 through wiring patterns 224 and 226, and the control circuit 232 may perform a control to keep the output of the light emitting portion 140 constant, for example.

As such, according to an example, the light emitting portion 140 and the light receiving portion 150 can be hermetically sealed by forming the encapsulating electrodes 170 and 190 to surround the outer periphery of the light emitting portion 140 and the light receiving portion 150, and by connecting the encapsulating electrodes 170 and 190 to the mounting substrate 210. In addition, by electrically connecting the encapsulating electrodes 170 and 190 to the p-side driving electrodes 160 and 180, the p-side driving electrodes 160 and 180 can be extracted to a surface of the substrate through the encapsulating electrodes 170 and 190. Moreover, by integrally forming the light emitting portion 140 and the light receiving portion 150 on a substrate, and forming p-side and n-side driving electrodes on the surface, flip-chip mounting can be achieved.

Figure 5:
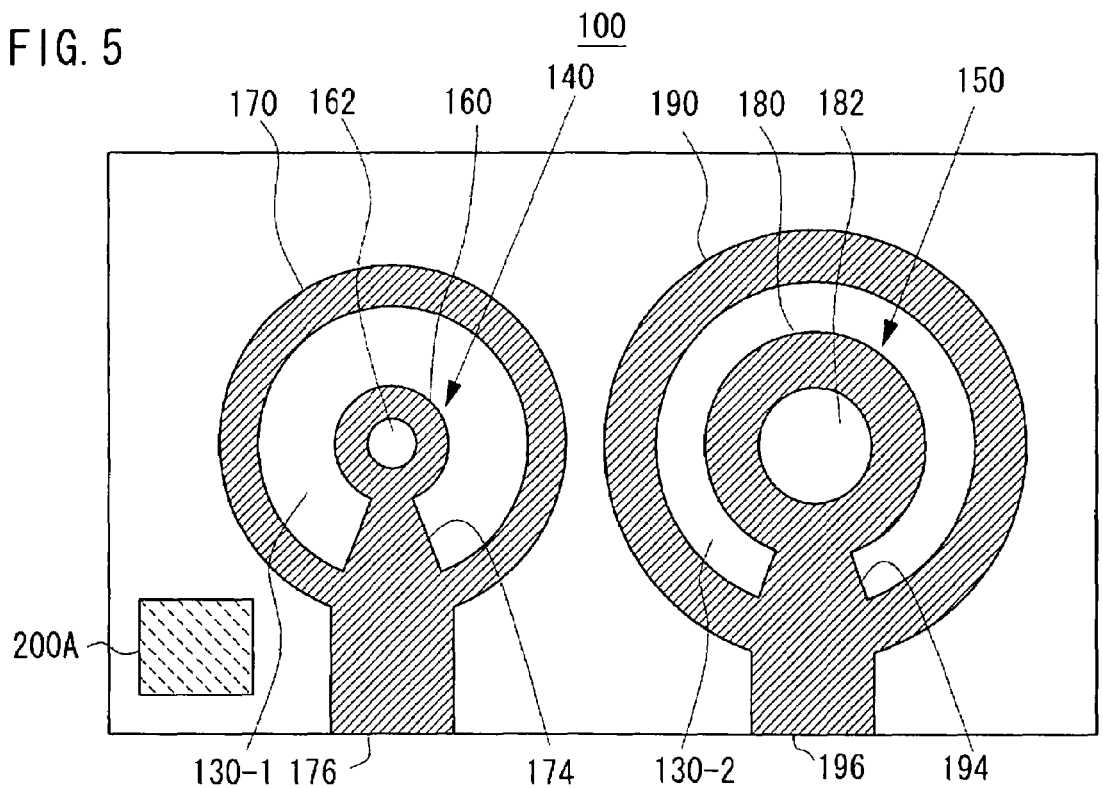
FIG. 5 shows a modified example of a semiconductor device of a first example.

In the examples described above, as shown in FIG. 1A, the n-side driving electrode 200 is formed on the outer periphery of the semiconductor device 100; however, for example, as shown in FIG. 5, a rectangular n-side electrode pad 200A may be formed instead. In addition, in the examples described above, the n-type semiconductor layer is formed on the n-type substrate; however, an n-type semiconductor layer may be formed on an insulating substrate, and a p-type semiconductor layer may be formed thereon. Of course, the configuration of n-type and p-type may be vice versa.

Moreover, in the examples described above, the light emitting portion 140 and the light receiving portion 150 are formed on the n-type substrate; however, the elements to be formed on a substrate are not limited to these elements. For example, plural posts arranged in two dimensional arrays may be formed on a substrate, and a light emitting portion may be formed in each of the posts, and an encapsulating electrode may be formed to surround each of the light emitting portions. Each of the light emitting portions may be a VCSEL or an LED.

In addition, in the examples described above, to define the area of the light emitting portion 140 or the light receiving portion 150, the cylindrical post is formed by the ring shaped groove; however, the shape of the groove may be rectangular or other shapes. Moreover, the mounting substrate does not necessarily pass light in its entire region, and only the region that corresponds to a light emitting portion or a light receiving portion may have optical transparency.

A method for fabricating a semiconductor device of an example will be described hereinafter. FIGS. 6A to 6C and FIGS. 7A to 7C show a process for the semiconductor device shown in FIG. 1A in cross section take along line A-A. FIGS. 8A to 8C and FIGS. 9A to 9C show a process in cross section take along line B-B of FIG. 1A.

Figure 6A:
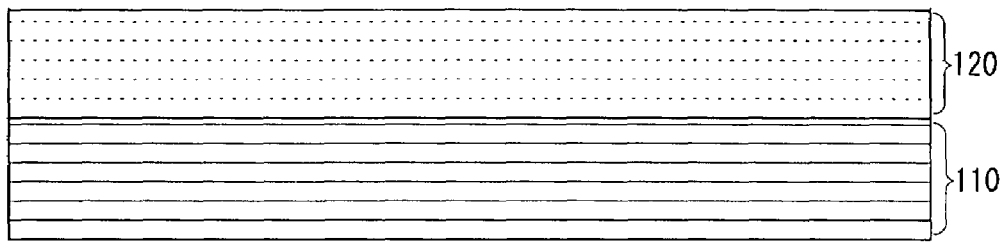
FIGS. 6A to 6C show a process for fabricating a semiconductor device of a first example, in cross section take along line A-A of FIG. 1A.
Figure 8A:
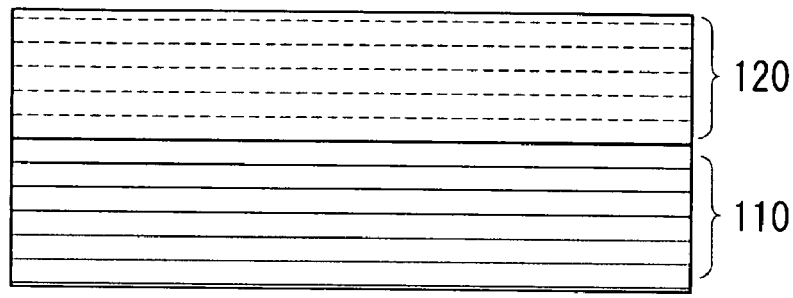
FIGS. 8A to 8C show a process for fabricating a semiconductor device of a first example, in cross section take along line B-B of FIG. 1A.

As shown in FIG. 6A and FIG. 8A, the n-type semiconductor layer 110 and the p-type semiconductor layer 120 are overlaid on an insulating substrate or an n-type semiconductor substrate by epitaxial growth. In a case where the light emitting portion is a VCSEL, an active layer or a current confining layer is formed between the n-type semiconductor layer 110 and the p-type semiconductor layer 120, and the semiconductor layers 110 and 120 are made to be DBRs. For example, by Metal Organic Chemical Vapor Deposition (MOCVD), an n-type GaAs buffer layer, an n-type DBR in which 40.5 periods of $Al_{0.9}Ga_{0.1}As$ and $Al_{0.12}Ga_{0.88}As$, each having a film thickness of ¼ of the wavelength in the medium, an undoped quantum well active layer, a p-type DBR in which 30 periods of $Al_{0.9}Ga_{0.1}As$ and $Al_{0.15}Ga_{0.85}As$, each having a film thickness of ¼ of the wavelength in the medium, are sequentially stacked on a GaAs substrate. The lowermost layer of the p-type semiconductor layer 120 may be a current confining layer made of AlAs, and the topmost layer thereof may be a GaAs contact layer having a high carrier concentration.

Figure 6B:
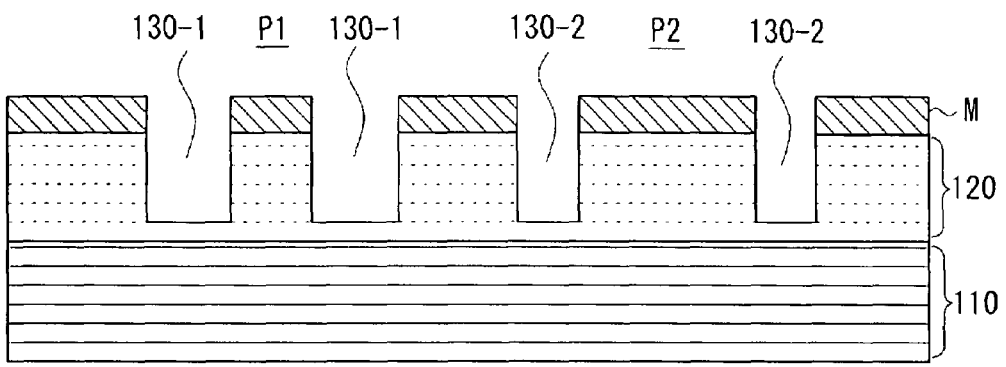
Figure 8B:
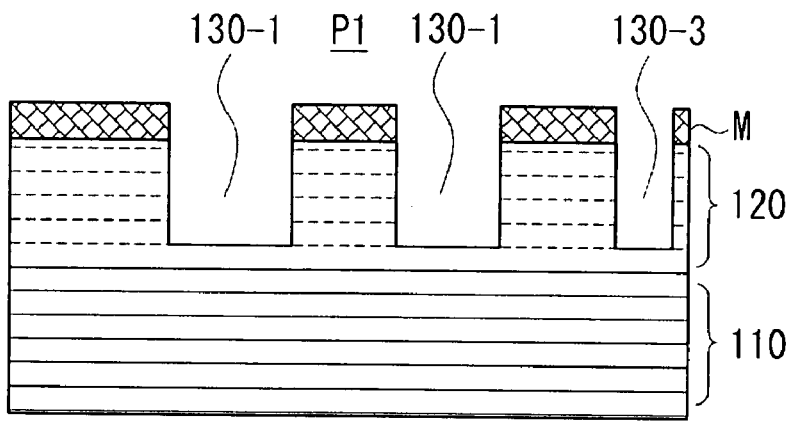

Then, as shown in FIG. 6B and FIG. 8B, a mask M is formed on the semiconductor layer 120 by a photolithography process. By using the mask M, the semiconductor layer is anisotropically etched to form the grooves 130-1, 130-2, and 130-3 on the substrate. The depth of the grooves is within the p-type semiconductor layer 120. By the groove 130-1, the post P1 for forming a light emitting portion is formed, and by the groove 130-2, the post P2 for forming a light receiving portion is formed. The groove 130-3 is used for the area to connect an n-side driving electrode described later to the n-type semiconductor layer 110.

Figure 6C:
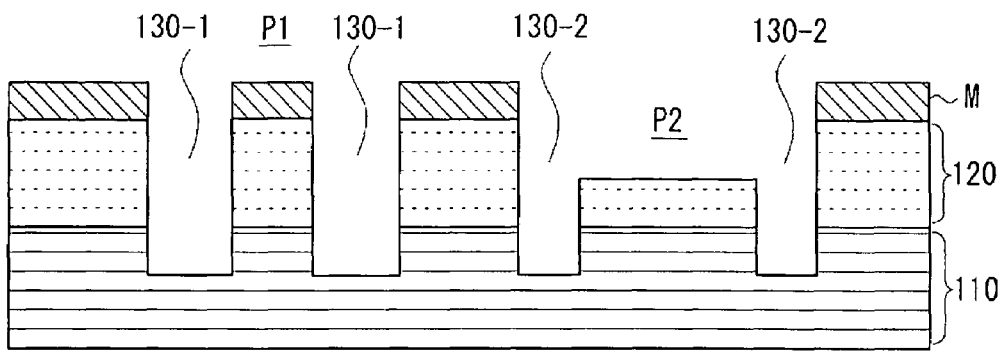
Figure 8C:
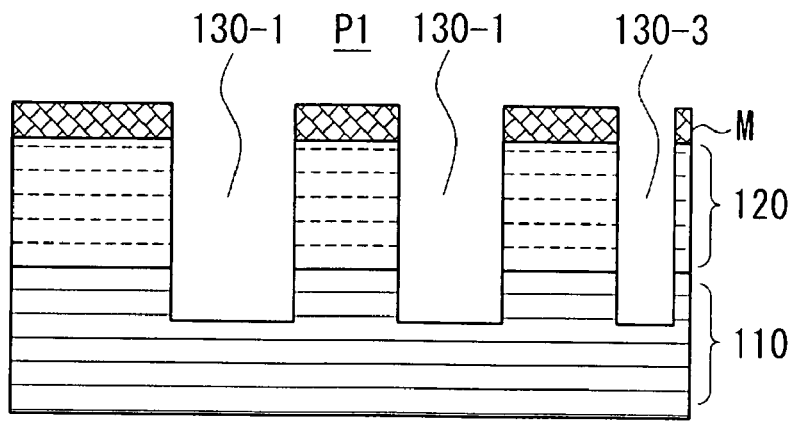

Then, as shown in FIG. 6C and FIG. 8C, only the mask that covers the top portion of the post P2 is removed, and the semiconductor layer is etched again. By this etching, a portion of the p-type semiconductor layer of the post P2 is removed, and the post P2 becomes lower than the post P1. In addition, the grooves 130-1, 130-2 and the groove 130-3 are etched, and the depth of the etching reaches the n-type semiconductor layer 110. In a case where the height of the post P1 is to be made lower, the mask that covers the top portion of the post P1 is removed, and then the etching described above is performed.

Figure 7A:
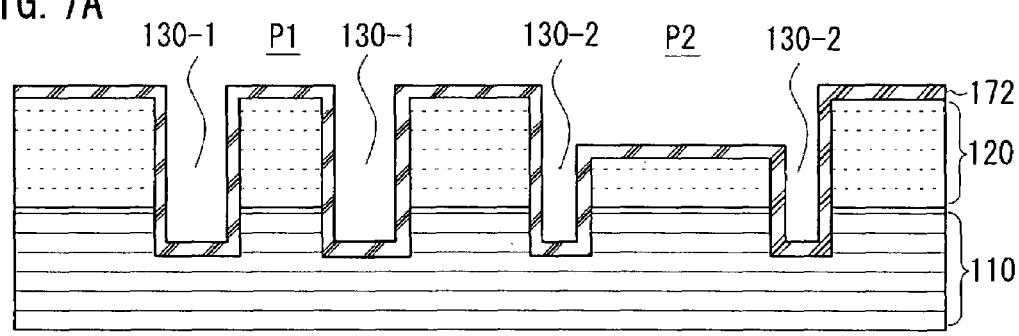
FIGS. 7A to 7C show a process for fabricating a semiconductor device of a first example, in cross section take along line A-A of FIG. 1A.
Figure 7B:
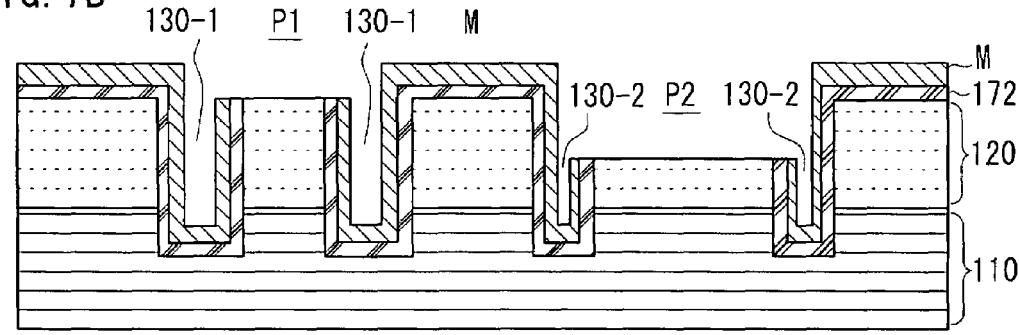
Figure 9A:
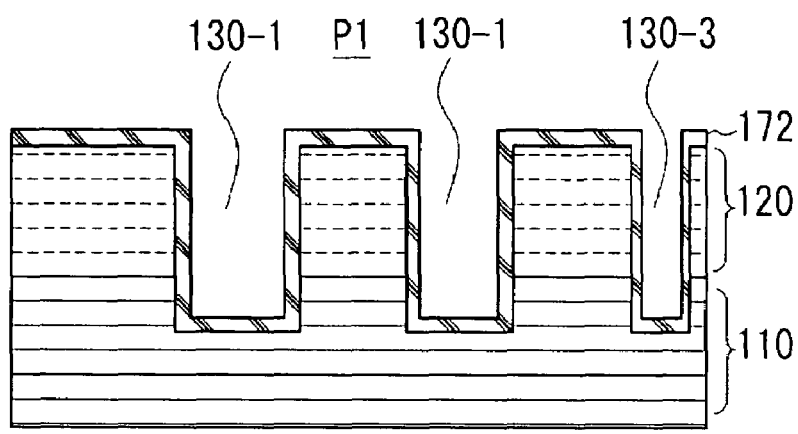
FIGS. 9A to 9C show a process for fabricating a semiconductor device of a first example, in cross section take along line B-B of FIG. 1A.
Figure 9B:
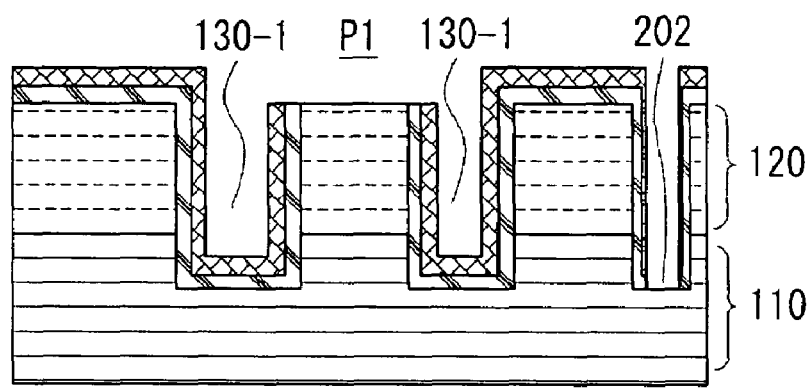

As shown in FIG. 7A and FIG. 9A, after the mask M is removed, the insulating layer 172 is formed on the entire surface of the substrate to electrically insulate the p-type semiconductor layer 120 and the n-type semiconductor layer 110 in the grooves 130-1, 130-2, and 130-3. Then, as shown in FIG. 7B and FIG. 9B, the mask M is formed onto the area excepting top portions of the post P1 and P2, and an etching is performed by using the mask. By this etching, the insulating layer 172 at top portions of the posts P1 and P2 are etched out, and the p-type semiconductor layer 120 on the surface is exposed. In addition, at a bottom portion of the groove 130-3, the contact hole 202 is formed in the insulating layer 172, and the n-type semiconductor layer 110 is exposed.

Figure 7C:
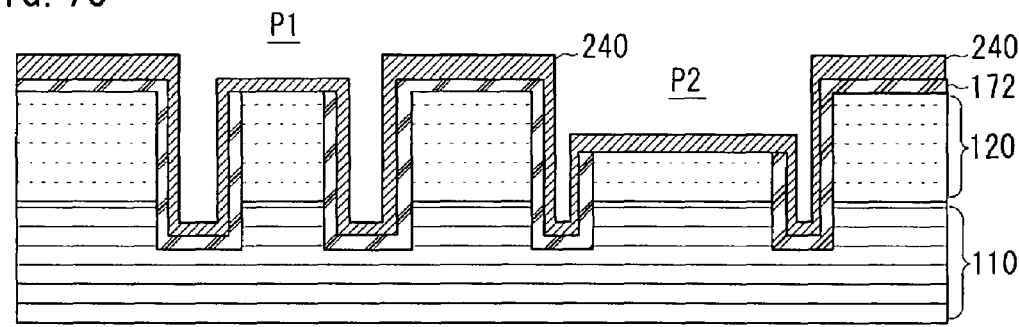
Figure 9C:
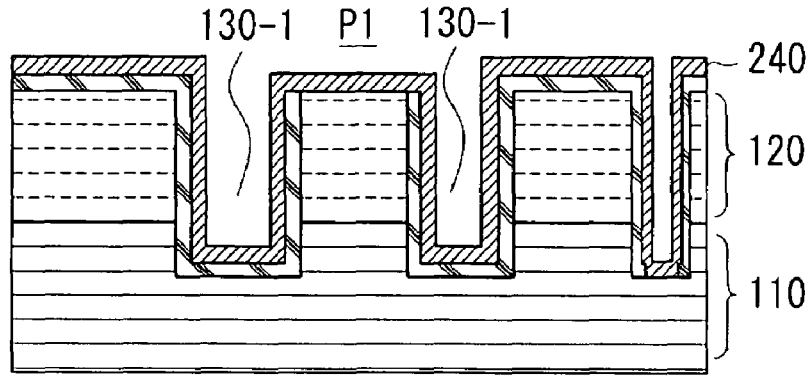
Figure 11A:
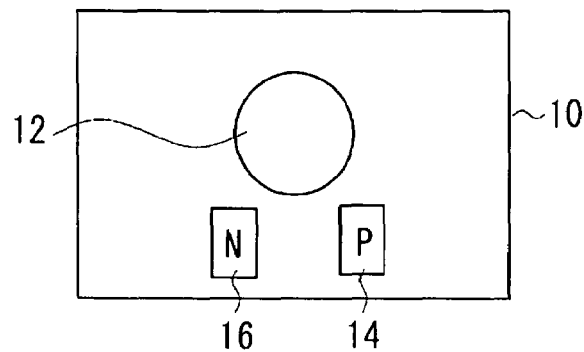
FIGS. 11A to 11C show a configuration of a semiconductor device module of a related art.
Figure 11B:
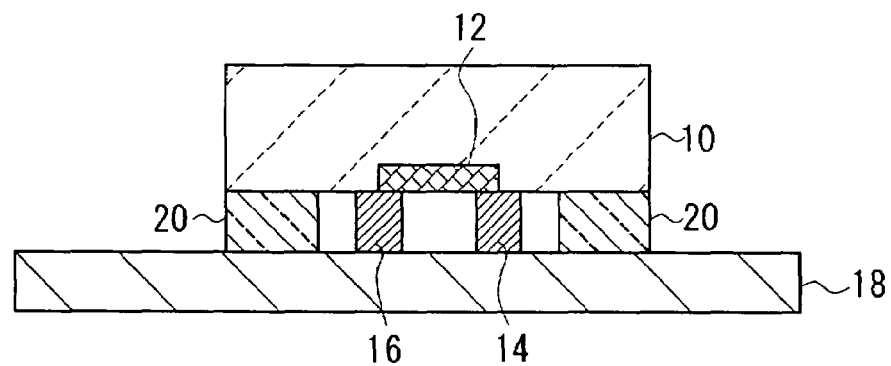
Figure 11C:
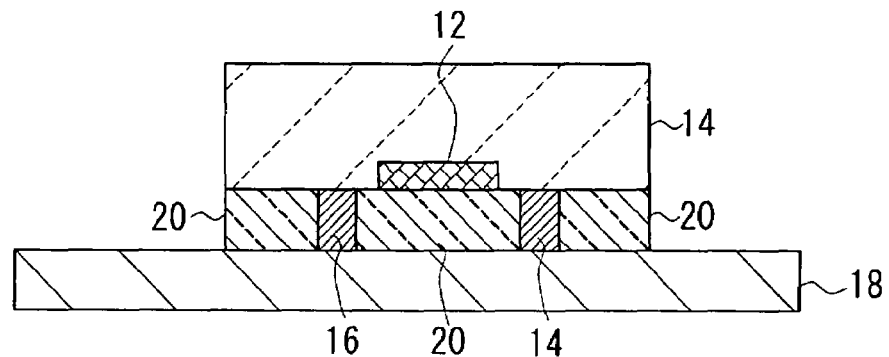
Figure 12A:
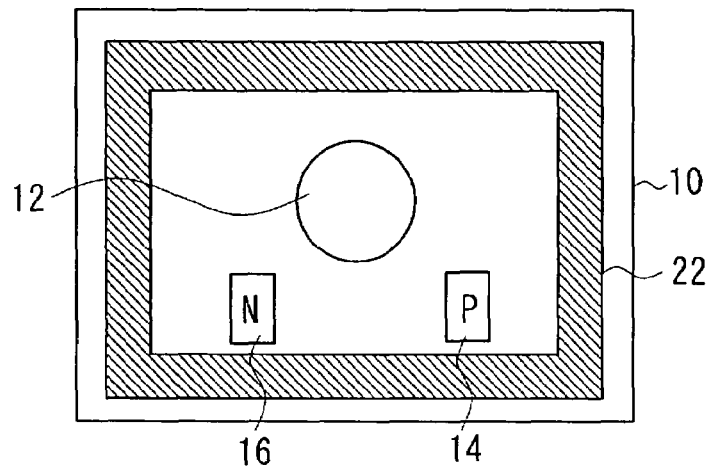
FIGS. 12A and 12B show a configuration of a semiconductor device module of a related art.
Figure 12B:
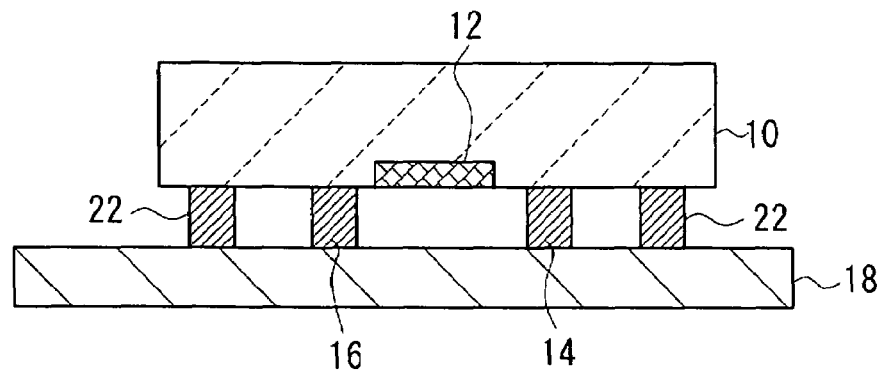

Then, the mask M is removed, and an electrode 240 is formed on the entire surface of the substrate as shown in FIG. 7C and FIG. 9C. The electrode 240 is then patterned, and the p-side driving electrodes 160 and 180, the encapsulating electrodes 170 and 190, and the n-side driving electrode 200 are formed as shown in FIG. 1A.

In a case where the light emitting portion 140 is a VCSEL, after the process of FIG. 6C and FIG. 8C, an oxidizing process is performed. By the oxidizing process, the lowermost layer of the p-type semiconductor layer 120, an AlAs layer, may be oxidized for a specified distance from a side surface of the post P1 to obtain a current confining layer.

An application example of a semiconductor device module according to an example is now described. FIG. 10A shows an example of a configuration in which a semiconductor device module is applied to a living object sensor. On the mounting substrate 210 of a semiconductor device module 104, wiring patterns 220, 222, 224, and 226 are formed. Each of the wiring patterns 220, 222, 224, and 226 is connected to the n-side driving electrode 200, encapsulating electrode 170 (p-side driving electrode 160), encapsulating electrode 190 (p-side driving electrode 180), and n-side driving electrode 200 of the semiconductor device 100, respectively. The wiring patterns 220 and 222 are connected to a driving circuit 250, and the wiring patterns 224 and 226 are connected to an amplifier 254. The driving circuit 250 drives the light emitting portion 140 in response to an input signal from an input circuit 252, and irradiates a living object 260 with light L1 having a wavelength of λ from the light emitting portion 140. The living object may be a human body, for example. Light L2 reflected off the living object 260 is received by the light receiving portion 150, and its electrical signal is amplified by the amplifier 254, and outputted from an output circuit 256. From this output signal, information regarding the bloodstream can be measured, for example.

In a case where a semiconductor device module is applied to a living object sensor as described above, each of the light emitting portion 140 and the light receiving portion 150 is encapsulated in the mounting substrate 210 by the encapsulating electrodes 170 and 190, and thus leakage of light from the light emitting portion 140 to the light receiving portion 150, or leakage of light received by the light receiving portion 150 to the light emitting portion 140 can be prevented, and a more accurate measurement can be performed.

A semiconductor device according to an aspect of the present invention and a semiconductor device module using the semiconductor device can be used in fields such as optical data processing, optical high speed data communication, living object sensor, or the like.

The foregoing description of the examples has been provided for the purposes of illustration and description, and it is not intended to limit the scope of the invention. It should be understood that the invention may be implemented by other methods within the scope of the invention that satisfies requirements of a configuration of the present invention.

What is claimed is:

1. A semiconductor device, comprising:
   a substrate;
   a semiconductor layer formed on the substrate;
   an optically functional portion formed by using at least a portion of the semiconductor layer, the optically functional portion performing light emission or light reception;
   a first driving electrode electrically connected to a semiconductor layer on a surface of the optically functional portion, the first driving electrode driving the optically functional portion; and
   an encapsulating electrode formed on the semiconductor layer to surround periphery of the optically functional portion, and electrically connected to the first driving electrode.

2. The semiconductor device according to claim 1, wherein the optically functional portion comprises a post structure and a groove that forms the post structure; wherein the first driving electrode is provided on the post structure, and wherein at least a portion of the encapsulating electrode is provided on the semiconductor layer outside of the groove when viewed from the post structure.

3. The semiconductor device according to claim 1, wherein the semiconductor layer comprises a first semiconductor layer of a first conductivity type and a second semiconductor layer of a second conductivity type on the first semiconductor layer; wherein the groove has a depth ranging from the second semiconductor layer to the first semiconductor layer; wherein the first driving electrode is electrically connected to the second semiconductor layer; and wherein the encapsulating electrode is formed on an insulating layer that is formed on the semiconductor layer and extending along the groove, and connected to the first driving electrode.

4. The semiconductor device according to claim 3, wherein a second groove is provided outside of the encapsulating electrode when viewed from the post structure; and wherein a second driving electrode is formed on the semiconductor layer outside of the second groove when viewed from the post structure, the second driving electrode driving the optically functional portion, and being electrically connected to the first semiconductor layer through a contact hole provided at a bottom portion of the second groove.

5. The semiconductor device according to claim 1, wherein the height of the first driving electrode in a vertical direction from the substrate is lower than the height of the encapsulating electrode.

6. The semiconductor device according to claim 1, wherein the optically functional portion comprises a plurality of surface emitting semiconductor laser devices arranged in two dimensional arrays, and each of the surface emitting semiconductor laser devices is surrounded by the encapsulating electrode through a groove, respectively.

7. The semiconductor device according to claim 1, wherein the optically functional portion comprises at least one light emitting portion and at least one light receiving portion that receives a portion of light emitted by the light emitting portion; and wherein the light emitting portion and the light receiving portion are surrounded by the encapsulating electrode through a groove.

8. An optical apparatus comprising:
   a semiconductor device; and
   a mounting substrate on which the semiconductor device is mounted;
   wherein the semiconductor device includes a substrate, a semiconductor layer formed on the substrate, an optically functional portion formed by using at least a portion of the semiconductor layer, the optically functional portion performing light emission or light reception, a first driving electrode electrically connected to a semiconductor layer on a surface of the optically functional portion, the first driving electrode driving the optically functional portion; and an encapsulating electrode formed on the semiconductor layer to surround periphery of the optically functional portion, and electrically connected to the first driving electrode,
   and wherein the mounting substrate faces the optically functional portion and the encapsulating electrode, and the encapsulating electrode is connected to a wiring layer formed on the mounting substrate, and
   the mounting substrate passes light at a position that corresponds to the optically functional portion.

9. The optical apparatus according to claim 8, wherein the encapsulating electrode of the semiconductor device is electrically connected to an electronic circuit on the mounting substrate through the wiring layer.

10. The optical apparatus according to claim 8, wherein the semiconductor device is encapsulated with a resin.

11. The optical apparatus according to claim 8, wherein the semiconductor device irradiates a living object with light emitted from the optically functional portion, and receives light reflected therefrom or scattering light.

* * * * *